United States Patent [19]

Borofka et al.

[11] 4,038,612
[45] July 26, 1977

[54] SWEPT OSCILLATOR AUTOMATIC LINEARIZER

[75] Inventors: Robert P. Borofka, Granada Hills; Lynn R. Barton, Glendale, both of Calif.

[73] Assignee: International Telephone and Telegraph Corporation, New York, N.Y.

[21] Appl. No.: 688,750

[22] Filed: May 21, 1976

[51] Int. Cl.² .......................................... H03B 23/00
[52] U.S. Cl. .......................................... 331/178; 331/4; 328/184; 325/335
[58] Field of Search .................. 331/4, 178; 328/184; 325/332, 335; 324/77 C, 77 CS

[56] References Cited

U.S. PATENT DOCUMENTS

| | | | |
|---|---|---|---|
| 3,144,623 | 8/1964 | Steiner | 331/178 |
| 3,382,460 | 5/1968 | Blitz et al. | 331/4 |
| 3,504,294 | 3/1970 | Martin, Jr. | 331/4 |
| 3,576,498 | 4/1971 | Hirsch | 331/178 |
| 3,621,450 | 11/1971 | Blair | 331/178 |
| 3,699,448 | 10/1972 | Martin et al. | 331/178 |
| 3,764,933 | 10/1973 | Fletcher | 331/4 |
| 3,931,586 | 1/1976 | Carpenter | 331/178 |

Primary Examiner—John Kominski
Attorney, Agent, or Firm—William T. O'Neil

[57] ABSTRACT

A device for generating a repetitive, highly-linear, frequency ramp. A voltage controlled oscillator responds to a ramp generator to produce the desired frequency modulation, and means are included for modifying the ramp amplitude vs. time shape as a function of the variation of instantaneous values of the frequency ramp from the linearized ideal.

5 Claims, 5 Drawing Figures

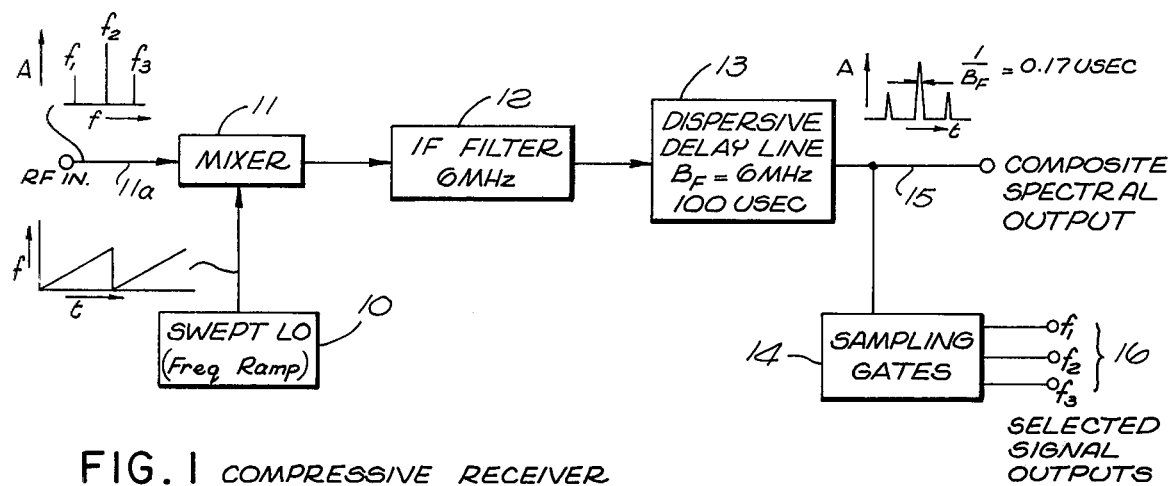
FIG. 1 COMPRESSIVE RECEIVER (PRIOR ART)
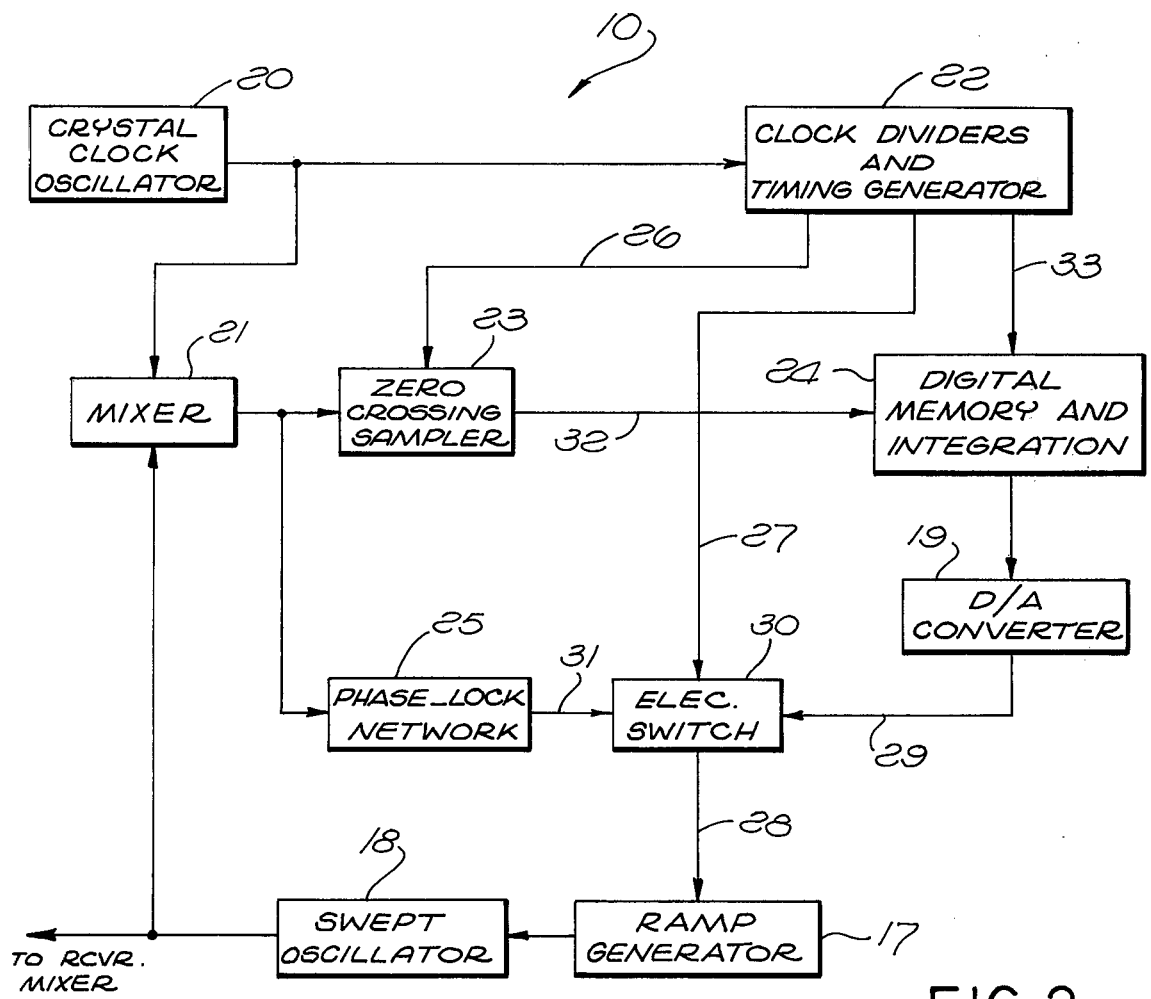
FIG. 2

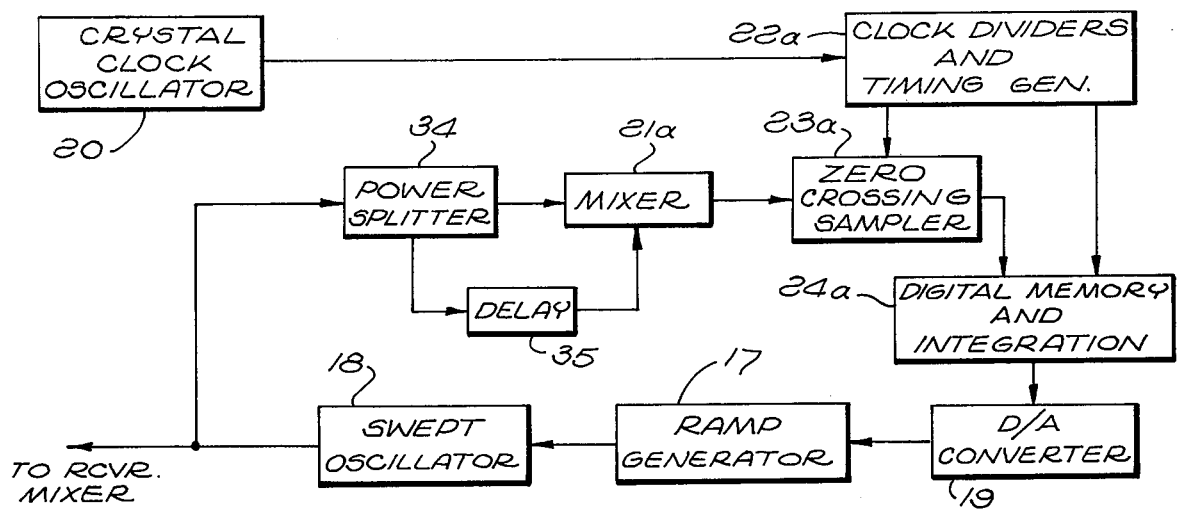
FIG. 3
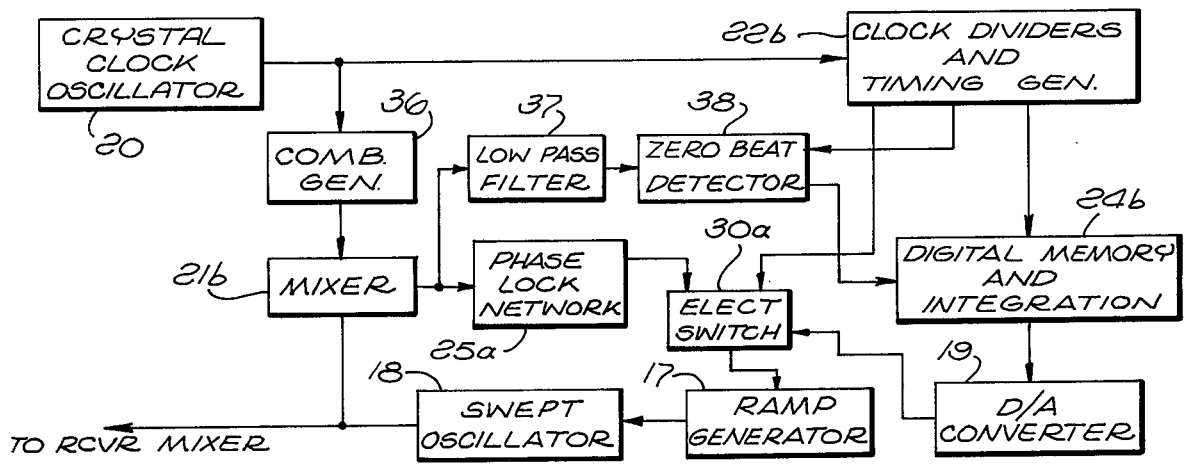
FIG. 4
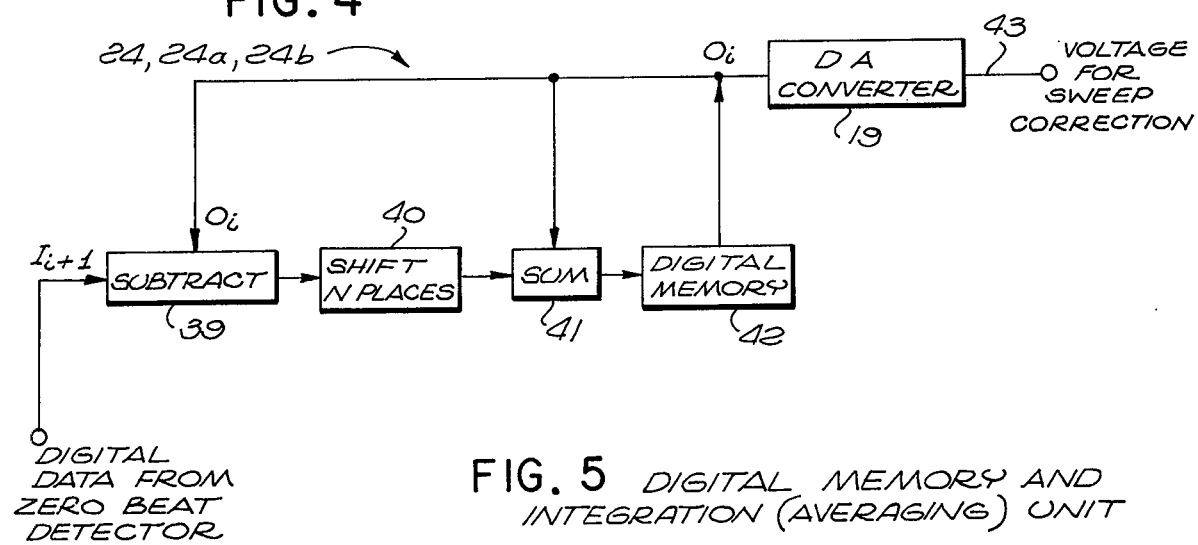
FIG. 5 DIGITAL MEMORY AND INTEGRATION (AVERAGING) UNIT

SWEPT OSCILLATOR AUTOMATIC LINEARIZER

BACKGROUND OF THE INVENTION

1. Field of the Invention

The invention relates generally to frequency modulation techniques and more specifically, to repetitive frequency sweep or ramp generators.

2. Description of the Prior Art

In the prior art, swept oscillators are extant for various purposes. Among these purposes is the provision of a continuously variable (over each of a series of repetitive cycles) local oscillator signal for a panoramic surveillance receiver. Where such receivers are of the relatively sophisticated type, such as the so-called compressive receiver described, for example, in U.S. Pat. No. 2,882,395, there is the additional requirement for a high degree of linearity of the function df/dt. Still further, the satisfactory operation of the so-called compressive receiver, which uses a dispersive delay line demands a high degree of linearity of the frequency ramp which provides the local oscillator function of such a compressive receiver.

In the prior art, various approaches to the linearity problem have been taken. Where the controlled oscillator, which actually generates the frequency ramp, is one of the forms of known voltage controlled oscillators, there are inherent non-linearities. That is, the instantaneous oscillator frequency is not a linear function of the instantaneous control voltage over a useful range of oscillator frequencies. Accordingly, the generation of a highly linear control voltage as a function of time does not accomplish the objective of providing a linear frequency ramp. Various open-loop techniques are available for improving this situation, all of these involving tailoring or pre-shaping of the oscillator control voltage as a function of time. In this way, a compensating distortion is introduced. Various function generators, such as diode shaping networks, etc., are available to effect this intentional distortion of the control voltage, the degree of compensation obtainable (i.e., the granuality of the correction) being related to the number of points at which correction is effected, and therefore the amount of equipment devoted to it.

Quite obviously, the open loop approach cannot compensate for component aging, temperature effects, etc.

A closed-loop system based on application of the frequency ramp to a discriminator to generate a correction signal offers a possible approach to a closed-loop system, however, the linearity of the discriminator itself then becomes a factor in the problem.

Specific prior art examples of sweep and frequency ramp generators in U.S. Patents include Nos.: 3,144,623; 3,504,293; 3,621,450; 3,764,933; 3,221,266; 3,528,033; 3,699,448; 3,872,406; 3,382,460; 3,530,399; 3,723,898 and 3,931,586.

The manner in which the unique combination of the present invention deals with the problems of the prior art will be evident as this description proceeds.

SUMMARY OF THE INVENTION

In accordance with the foregoing discussion of the prior art, it may be said to have been the general objective of the present invention to produce a frequency ramp generator affording a high degree of constancy in the frequency rate factor df/dt. The device was conceived and constructed with particular emphasis on its use to provide a swept local oscillator signal for use in devices such as the aforementioned compressive receiver for frequency band surveillance.

The present invention makes use of a controllable oscillator (VCO) responsive to a control voltage ramp. Accurately controlled error-sensing means are provided for detecting variations of the instantaneous frequency of the frequency ramp generated by the VCO at predetermined accurately-timed points. The discrete errors at these plural points throughout the frequency ramp are computed and integrated over a plurality of sweep cycles and then are used to compensate a control voltage ramp.

In the description hereinafter, several embodiments are described for the implementation of the linear frequency ramp generator (frequency sweep or swept frequency generator) according to the present invention.

BRIEF DESCRIPTION OF THE DRAWINGS

FIG. 1 is a block diagram of a compressive receiver, known per se in the prior art, and representative of a device requiring an effectively linearized frequency ramp.

FIG. 2 depicts a first form of the frequency ramp generator according to the present invention.

FIG. 3 depicts a second form of frequency ramp generator according to the present invention and particularly adaptable at microwave frequencies.

FIG. 4 depicts a third or "comb generator" instrumentation for providing the highly linear frequency ramp according to the present invention.

FIG. 5 shows a logical block diagram for the memory and integration unit for use in the embodiments of FIGS. 2, 3 and 4.

DESCRIPTION OF THE PREFERRED EMBODIMENTS

In FIG. 1, a typical compressive receiver configuration is depicted. This compressive receiver is basically a superheterodyne circuit analogous (up to the dispersive filter) to a conventional scanning superheterodyne. A mixer 11 responds to the signals within a predetermined frequency band, for example, the three signals $f1, f2$ and $f3$, as shown at the input 11a. A high-speed frequency ramp is provided by block 10 depicted as a swept local oscillator. When applied to the mixer 11, the frequency ramp, which constitutes the output of block 10, produces a set of frequency modulated signals in the IF domain at the output of mixer 11 corresponding to $f1, f2$ and $f3$ at the input 11a.

The dispersive delay line determined by block 13, typically 6 MHz bandwidth and 100 $\mu$sec dispersion in one example of a practical compressive receiver, defines the required scan rate, produced in 10. If the difference frequency generated by mixing the scanning local oscillator with the input signal 11a in the mixer 11 is made to scan across the IF bandwidth in a time equal to the delay line dispersion, then all the energy of each frequency modulated signal at the input to the delay line 13 comes out of the delay line 13 as an impulse. The shape of this time response will be the impulse response of the IF filter.

If full sensitivity is to be maintained in conventionsl scanning receiver, its scan speed is limited by its resolution. The compressive receiver, on the other hand, as compared to the conventional panoramic or scanning receiver, overcomes this restriction by placing a local frequency "coding" on the received signal through the use of a high-speed linearly-scanned local oscillator. This code is matched to a dispersive delay line 13 in FIG. 1. Thus, the compressive receiver local oscillator and delay line may be thought of as forming a matched filter pair. The output of the delay line therefore comprises compressed pulse whose time positions with respect to the receiver scan are directly related to the frequency of the signal at the receiver input 11a.

It will be noted that mixer images are frequency modulated in the "wrong direction" and are not matched to the delay line. Consequently, they do not produce a significant output.

The duration of the compressed pulse emerging from the delay line is approximately equal to the reciprocal of the delay line bandwidth. If this bandwidth is, for example, 6 MHz, as illustrated in connection with FIG. 1, the duration of the output pulse will be small, for example, about 0.17 microseconds and the frequency resolution is correspondingly high. The frequency resolution is approximately equal to the reciprocal of the dispersion of the delay line. For a dispersion of 100 microseconds, for example, the ideal frequency resolution is 10 kHz.

To produce the match filter effect required, as aforementioned, the frequency vs. time dispersion of the delay line must be the same as the sweep speed of the local oscillator. If these conditions are met, substantially all of the signal energy in the IF sweep pulse entering the delay line will emerge at the output at nearly the same instant of time. From this it will be realized that the requirement for linearity and repeatability on the frequency ramp, which is the output of the swept LO 10, is stringent if the matched pair relationship aforementioned, vis-a-vis, the dispersive delay line 13, is to be met and preserved. The output of the dispersive delay line 13 providing the pulses as aforementioned is depicted at the composite spectral output 15.

As an incidental matter, temporally controlled sampling gates 14 may be employed to separate the pulses corresponding to frequencies $f_1$, $f_2$ and $f_3$ at 16. This instrumentation also demands that the frequency ramp at the output of 10 be quite linear, repeatable and stable, and with requirements such as this in mind, the further description hereinafter of the details of the invention itself, which produces this highly linear stable and repeatable frequency ramp, will be appreciated. Of course, the compressive receiver instrumentation is to be understood to be only one environment or one example of the utility of the present invention. Others will suggest themselves quite readily to those skilled in this art.

Referring now to FIG. 2, the frequency ramp generator 10 is shown in a first form, particularly adaptable to VHF and UHF frequencies. In the frequency ramp generator of FIG. 2, the error detection and correction (control) circuits are instrumented digitally, however as this description proceeds and the principals of the present invention are understood, persons of skill in this art will recognize the potential for analog implementation of the invention. The swept oscillator 18 is of the signal-controlled type which produces the output frequency ramp in response to a voltage or current ramp from ramp generator 17. In solid state instrumentation, the control signal is often a current function, hence the use of the more generic term signal control oscillator for 18. The ramp generator 17 is modulatable, i.e., its instantaneous amplitude value may be modified throughout the duration of the ramp at predetermined points therealong in accordance with the output of digital/analog converter 19.

For purposes of illustration, the frequency and time parameters applicable to a particular device constructed in accordance with the present invention, will be referred to. In that particular example, the frequency ramp was required to sweep from 206 to 194 MHz in 200 microseconds. The generally saw-tooth tuning signal from 17, was of substantially the same duration, i.e., 200 microseconds, plus a 20 microsecond flyback or reset time. During this reset time, the sweep oscillator frequency resets at 206 MHz which is the frequency of the crystal clock oscillator 20. The mixer 21 provides the difference between the instantaneous ramp frequency (output of 18) and the stable reference frequency provided by 20.

Clock divider and timing generator 22 is comprised of straight-forward and well-known digital circuitry responsive to the 206 MHz output of 20 to provided timing signals at discrete sampling and correction points within the frequency ramp, these timing signals being applied on 26 to the zero crossing sampler 23. The circuits of 22 also time the operation of the digital memory and integration circuits 24, the operation of which will be more fully explained hereinafter.

Still further, timing signals from block 22 operate to control a phase-lock network 25 in accordance with timing control signals on 27 to the electronic switch 30. In accordance therewith, electronic switch 30 chooses between the outputs between output 29 of the digital-/analog converter 19 and the output 31 from the phase-lock network 25. When switch 30 is operative to connect 31 to the lead 28, the components thereafter, including 17, 18, 21 and 25, comprise a phase-lock loop operative during the aforementioned 20 microsecond reset time as dictated by the control signals on 27 applicable to 30. The phase-lock loop or network 25 need only comprise a discriminator, appropriate filtering, gain, and whatever bias-level setting means are necessary in order to insure that the level at 31 (and therefore at 28) durin the aforementioned 20 microsecond reset time, is approximately that which would control 18 into frequency equality with 20.

In the alternate position of electronic switch 30 (200 microseconds) as controlled from 22, the digital-to-analog converter 19 provides the modulation (corrections) to the output of 17 in accordance with the sampling effected in 23 as aforementioned.

By insuring the initial frequency and phase of the frequency ramp produced in 18, the repeatability of the frequency ramp during each cycle thereof is greatly enhanced.

Beginning at zero, the output of 21 climbs to 12 MHz in the 200 microsecond sweep duration, and during this time there are programmed 12 (for example) selected zero crossings of this difference signal (the output of 21). Considering the frequency modulated nature of the signal at the output of 21, it will be realized that these zero crossing points are not a series of uniformly spaced points. Being spaced in accordance with the increasing frequency however, they can provide a measure of the deviation or instantaneous error from the zero crossover from an ideally linear frequency ramp at each point.

In accordance with the foregoing, the signals on lead 32 from the zero-crossing sampler to the memory and integrator 24, are real-time samples. The memory in 24 simply stores these samples over a number of cycles of the frequency ramp and integrates the individual errors represented within the samples on 32, for each sample point over a plurality of sweep cycles. Accordingly, a plurality of correction signals which are derived from this error averaging process, are fed to digital/analog converter 19 which then provides an appropriately timed plurality of correction signals on lead 29 through electronic switch 30 and lead 28 to the ramp generator 17. These correction signals are timed synchronously, corresponding to the sampling points, but obviously are applied to a later frequency ramp than the ramps from which the samples were integrated.

This entire process may be thought of as a low-pass process. These analog-signal corrections modify the slope on an instantaneous basis at the corresponding plural points within the ramp generated in 17 to effect linearization of the frequency ramp output of 18.

Over a relatively short period of time, the feedback loop stabilizes and the errors in the sweep become small, due to the integration in the digital memory. This frequency-rate feedback does not correct for errors in the compressive filter characteristic (13 of FIG. 1), but does correct for non-linearities in the sweep oscillator tuning curve and the ramp generator output to the extent that these can be approximated by a multi-segment linear function. Increasing the number of segments improves a correction but requires additional hardware, a 10-segment (10 point) correction arrangement was found to be very satisfactory in a particular implementation according to the invention. Since the feedback loop is continuously active, correction is achieved for temperature effect, drift (aging), and component replacement. The dispersive filter in the dispersive receiver application is adapted to temperature controlled operation and its perturbations are relatively well dealt with outside the frequency ramp generator closed loop.

Referring now to FIG. 3, another embodiment, particularly adapted for microwave operation, employing the principles of the present invention is shown. Like components are labeled as in FIG. 2.

The ramp generator and swept oscillator 17 and 18, respectively, as well as the digital/analog converter 19 and the digital memory and integration unit 24a are the full equivalent of the like components on FIG. 2, and their functions duplicate the functions described for the same components described on FIG. 2. In FIG. 3, the crystal clock oscillator 20 no longer provides a frequency reference to the mixer and the phase-lock loop arrangement included for frequency ramp initial condition stabilization is no longer required. The crystal clock oscillator 20 may therefore have a frequency which, in cooperation with the dividers in 22a, produces the zero-crossing sampler timing pulses as before, although the sampling is at a much higher basic frequency than is the case with FIG. 2. For operation where the swept oscillator 18 output is a microwave signal, a considerably faster and more frequent frequency ramp is envisioned. Whereas the repetition rate of the frequency ramp in the arrangement of FIG. 2 was on the order of 4.5 kHz, a microwave arrangement might require a frequency ramp repetition rate on the order of 1.5 MHz with, for example, five segments of linearization (five sampling points within each frequency ramp). Based on the same frequency dividing and timing pulse generation principles, the device 22a would be the functional equivalent of 22 in FIG. 2, although considerably faster logic would be involved. The same is true of the digital memory and integration unit 24a and the zero-crossing sampler 23a, as well as the digital/analog converter 19.

The basic difference in the instrumentation of FIG. 3 vis-a-vis FIG. 2 is that for the microwave case according to FIG. 3, the mixer is replaced by a delay-line type frequency discriminator comprising a power splitter 34, which simply divides the relatively small amount of powder taken from the output of 18 into two lines, one supplied directly to mixer 21a and the other to mixer 21a through delay 35. The delay provided by 35 is on the order of 6 nanoseconds consistent with the other parameters for FIG. 3, as aforementioned.

It is important to note that the output of mixer 21a is a signal having a frequency proportional to the slope of the frequency ramp which is the output of the swept oscillator 18, and accordingly, the zero-crossings of the signal at the output of mixer 21a will be perturbed by errors in the sweep linearity. Conversely, in the substantially zero error situation, the frequency represented at the output of 21a is constant over the duration of each cycle of the frequency ramp at the output of 18 and the frequency ramp is therefore ideally linear. Moreover, zero-crossings of this signal at the output of 21a remain constant in that situation. Otherwise, the storage of sampling point error values over a plurality of successive frequency ramps by digital memory and integration unit 24a is accomplished in the same manner as was the case in FIG. 2.

Referring now to FIG. 4, yet another embodiment according to the present invention is presented. The form and functions of the clock oscillator 20, clock dividers and timing generator 22b, digital memory and integration unit 24b, the digital-to-analog converter 19 and the mixer 21b, as well as ramp generator and sweep oscillator 17 and 18, respectively, are substantially the same as the comparable components of FIGS. 2 or 3. In FIG. 4 a comb generator 36, a low-pass filter 7 and a zero-beat detector 38 have been added, and the phase-lock loop of FIG. 2 is retained in this embodiment by using one of the comb lines.

In FIG. 4, the crystal clock oscillator synchronizes the comb generator 36, the latter producing a succession of evenly spaced (in frequency) spectral lines, which define corresponding frequency points within the frequency ramp at the output of 18. During retrace the sweep oscillator 18 is locked to a specific comb line. At this frequency ramp from 18 is mixed with the frequencies provided by the comb generator 36 in 21b, the result is a corresponding succession of zero-beat points as the instantaneous ramp frequency passes through each of the comb frequencies in succession. This zero-beat situation is obviously filterable with a low-pass filter, so that the frequency products between zero-beat points may be substantially eliminated. The low-pass filter 37 accomplishes this. The zero-beat detector at 38, which is essentially a zero frequency detector, will be seen to be synchronized by pulses from 22b defining the predetermined points at which the corrections of ramp generator 17 on an instantaneous basis are to be effected in the manner of FIGS. 2 and 3 and at times corresponding to the equivalent time separation between instantaneous frequencies on the ramp corresponding to adjacent comb frequencies.

The block 38 preferably comprises a phase detector which measures the phase of the signal out of the filter 37 (the difference frequency) these measurements being made discretely over the plurality of sample points as controlled from 22b within the time of each frequency ramp. That phase, if other than zero, constitutes an error voltage which the digital memory integration unit 24b treats point-by-point, in the same way as the equivalent circuitry in FIGS. 2 and 3. The digital-to-analog converter and the individual discrete corrections of the slope generated by the ramp generator 17 are automatically properly timed read-outs of the stored and integrated values in 21b. The ultimate result is linearization of the output of 18.

Referring now to FIG. 5, the logical arrangement of the digital memory and integration unit 24, 24a, or 24b will be seen. A channel of this type is needed for each sample point obtained during a scan. Those skilled in the digital instrumentation art will recognize this arrangement to provide a running average which is particularly adapted for use at 24, 24a and 24b. The output signal $O_i$ to 19 advances in accordance with the equation:

$$O_{i+1} = O_i + \frac{I_{i+1} - O_i}{2^N}$$

in response to $I_i + 1$ at the input to the subtractor 39. At the output of subtractor 39, only the difference between the last accumulated stored value in the digital memory 42 and the new value placed in 39 is passed on to element 40 which is a shift register, the output of 40 is equal to its input divided by $2^N$ where N is the number of places the data is shifted to the right. The algebraic summation in 41 continually updates the input to digital memory 42. Thus the output to the D/A converter 19, for each discrete correction point applied to the ramp generator 17 is approximately averaged over N occurrence or repetitions of the frequency ramp.

As previously indicated, and as is true in many digitally instrumented devices, analog methods could be applied to the memory and integration functions. Various other modifications to the specific instrumentation will suggest themselves to those skilled in these arts, once the principles of the present invention are well understood. Accordingly, it is not intended that the scope of the invention should be limited by the drawings or this description, these being typical and illustrative only.

What is claimed is:

1. A device for producing a repetitive, linear, frequency ramp, comprising:
    a signal-controlled oscillator and a ramp generator for generating and applying a repetitive oscillator control signal as a frequency controlling function to said oscillator to produce said frequency ramp;
    a zero-crossing sampler responsive to said frequency ramp;
    synchronizing means for controlling the initiation of each cycle of said repetitive oscillator control signal and for generating a series of sampling signals for said zero-crossing sampler at predetermined points in times at which the waves of said frequency ramp should be passing through zero if df/dt is constant, where f is ramp frequency and t is time;
    means for integrating the output of said sampler over at least a single cycle of said frequency ramp to generate a corresponding repetitive error signal, and for applying said error signal as a correction signal to said ramp generator to provide said oscillator control signal in whatever modified form is required to linearize said frequency ramp.

2. Apparatus according to claim 1 further including a stable fixed frequency source providing a reference frequency, and a mixer connected to form a beat signal between said frequency ramp and said reference frequency, said beat signal providing the input to said zero-crossing sampler.

3. Apparatus according to claim 1 further including a phase-lock loop and means for enabling said loop at the beginning of each cycle of said frequency ramp, said loop being operative between said beat signal and said frequency ramp to provide a fixed initial relationship between said frequency ramp initial frequency for each cycle thereof, with respect to said reference frequency.

4. Apparatus according to claim 1 in which said integrating means comprises a memory which operates to average said zero-crossing sampler output signals to apply said correction signal to later cycles of said ramp generator.

5. Apparatus according to claim 2 in which said integrating means comprises a memory which operates to average said zero-crossing sampler output signals to apply said correction signal to later cycles of said ramp generator.

* * * * *